(12) United States Patent
Arbogast et al.

(10) Patent No.: US 7,215,543 B2
(45) Date of Patent: May 8, 2007

(54) DUCT FOR COOLING MULTIPLE COMPONENTS IN A PROCESSOR-BASED DEVICE

(75) Inventors: Porter Arbogast, Fort Collins, CO (US); Robert L. Crane, Longmont, CO (US); Michael P. Eland, Fort Collins, CO (US); Steven E. Hanzlik, Fort Collins, CO (US); Arlen L. Roesner, Fort Collins, CO (US); Erick J. Tuttle, Fort Collins, CO (US); Tom J. Searby, Greeley, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 11/230,711

(22) Filed: Sep. 20, 2005

(65) Prior Publication Data

US 2006/0012957 A1 Jan. 19, 2006

Related U.S. Application Data

(63) Continuation of application No. 10/372,508, filed on Feb. 21, 2003, now Pat. No. 6,989,988.

(51) Int. Cl.
*H05K 7/20* (2006.01)
(52) U.S. Cl. ............... 361/695; 165/80.3; 165/121; 454/184
(58) Field of Classification Search ........... 361/687, 361/694–695, 719; 454/184
See application file for complete search history.

(56) References Cited

U.S. PATENT DOCUMENTS 5,422,787 A 6/1995 Gourdine
5,432,674 A 7/1995 Hardt
5,691,883 A 11/1997 Nelson
5,917,698 A 6/1999 Viallet
5,946,190 A 8/1999 Patel et al.
6,130,819 A 10/2000 Lofland et al.
6,130,820 A * 10/2000 Konstad et al. ............. 361/695
6,253,834 B1 7/2001 Sterner
6,330,154 B1 12/2001 Fryers et al.
6,397,927 B1 6/2002 Sterner
6,397,928 B1 6/2002 Sterner
6,397,929 B1 6/2002 Sterner
6,397,930 B1 6/2002 Sterner
6,400,568 B1 6/2002 Kim et al.
6,435,267 B1 8/2002 Sterner
6,459,580 B1 10/2002 Della Fiora et al.
6,474,409 B1 11/2002 Sterner
2004/0094599 A1 5/2004 Leubs

* cited by examiner

*Primary Examiner*—Greg Thompson

(57) ABSTRACT

A duct for cooling multiple components in a processor-based device. The duct has an inlet cooling duct section for a cooling airflow focused toward a processor region. The duct also has at least one exit cooling duct section for the cooling airflow extending from the inlet cooling duct section and focused toward a component region, wherein the cooling airflow is successively transportable through the processor region followed by the component region. A processor-based system having a focused cooling duct. The focused cooling duct comprises an inlet cooling duct section for a cooling airflow having a fan receptacle, and a plurality of exit cooling duct sections for the cooling airflow extending from the inlet cooling duct section and focused toward component regions, wherein the cooling airflow is successively transportable through the inlet cooling duct section followed by the plurality of exit cooling duct sections. The processor-based system also comprises a plurality of components disposed in the component regions.

19 Claims, 4 Drawing Sheets

DUCT FOR COOLING MULTIPLE COMPONENTS IN A PROCESSOR-BASED DEVICE

CROSS-REFERENCE TO RELATED APPLICATION

This is a continuation of application Ser. No. 10/372,508 filed on Feb. 21, 2003, now U.S. Pat. No. 6,989,988.

BACKGROUND OF THE INVENTION

Computer systems and other processor-based devices utilize a variety of cooling systems, such as fans and heat sinks, to maintain the components at acceptable operating temperatures. Depending on the particular application, one or more fans may be provided to flow air across the components. For example, a computer system may have one or more casing fans, processor fans, and other component-specific fans. Unfortunately, the relatively cool inlet airflows may be mixed with the air heated by internal components, thereby increasing the temperature of the inlet airflows. As the inlet airflows are heated by the internal components, the inlet airflows become relatively less effective at transferring heat away from specific components due to the reduced temperature differential between the inlet airflows and the specific components.

SUMMARY

According to one embodiment of the invention, a duct for cooling multiple components in a processor-based device comprises an inlet cooling duct section for a cooling airflow focused toward a processor region. The duct also comprises at least one exit cooling duct section for the cooling airflow extending from the inlet cooling duct section and focused toward a component region, wherein the cooling airflow is successively transportable through the processor region followed by the component region.

In another embodiment, a processor-based system comprises a focused cooling duct. The focused cooling duct comprises an inlet cooling duct section for a cooling airflow having a fan receptacle, and at least one exit cooling duct section for the cooling airflow extending from the inlet cooling duct section and focused toward a component region, wherein the cooling airflow is successively transportable through the inlet cooling duct section followed by the plurality of exit cooling duct sections.

In a further embodiment, a cooling system comprises means for channeling a cooling airflow across at least one processor. The cooling system also comprises means for subsequently refocusing via a duct the cooling airflow across at least one electronic component downstream from the at least one processor.

Another embodiment comprises a method for cooling multiple components in a processor-based device. The method comprises channeling a forced cooling airflow across a processor to transfer heat away from the processor. The method also comprises refocusing via a duct the forced cooling airflow heated by the processor toward at least one other electronic component downstream from the processor to transfer heat away from the at least one other electronic component.

BRIEF DESCRIPTION OF THE DRAWINGS

Exemplary embodiments will hereafter be described with reference to the accompanying drawings, wherein like reference numerals denote like elements, and.

DETAILED DESCRIPTION

Figure 1:
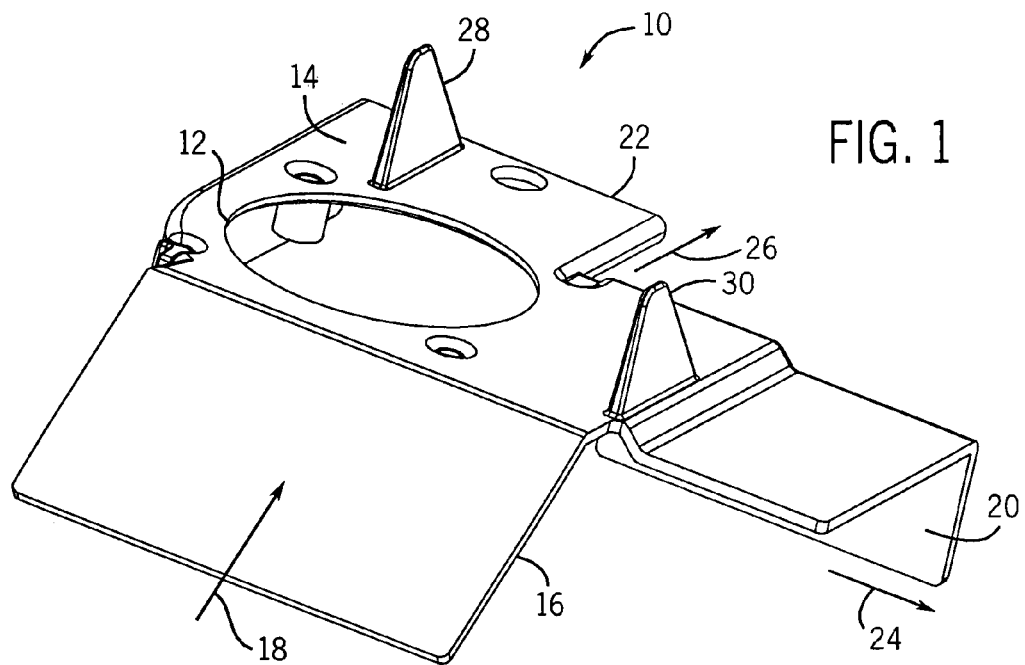
FIG. 1 is a top perspective view illustrating a multi-component-focused-cooling duct in accordance with certain embodiments of the present invention.

FIG. 1 is a top perspective view illustrating a multi-component-focused-cooling duct 10 in accordance with certain embodiments of the present invention. As illustrated, the multi-component-focused-cooling duct 10 comprises an air inlet and fan receptacle 12 disposed in a top panel 14 adjacent an inlet air deflector 16, which operates to deflect an inlet airflow 18 over the top panel 14 and at least partially into the air inlet and fan receptacle 12. For example, if a duct fan (not shown) is disposed in the fan receptacle 14, then the duct fan may draw a portion of the inlet airflow 18 into the multi-component-focused-cooling duct 10 below the top panel 14. Once below the top panel 14, the inlet airflow 18 may cool one or more components within the multi-component-focused-cooling duct 10 in a focused-component-cooling region (i.e., a cooling region in which the flow is directed and/or accelerated specifically toward a desired component to facilitate cooling). For example, the inlet airflow 18 may cool one or more temperature sensitive components (e.g., processors) disposed within the multi-component-focused-cooling duct 10, thereby transferring heat away from the components and into the inlet airflow 18.

The illustrated multi-component-focused-cooling duct 10 also comprises air exit ducts 20 and 22, which refocus (e.g., redirect, concentrate, and/or accelerate) the component-heated air toward one or more components in additional focused-component-cooling regions, as indicated by exit airflows 24 and 26, respectively. Although the exit airflows 24 and 26 have a relatively higher temperature than the inlet airflow 18, the air exit ducts 20 and 22 may channel the exit airflows 24 and 26 to one or more relatively higher-temperature components. For example, the higher-temperature components may have a higher operating temperature or a higher temperature tolerance than the upstream components or processors. In operation, heat is transferred away from the higher-temperature components and into the exit airflows 24 and 26. The air exit ducts 20 and 22 also may restrict one or both of the exit airflows 24 and 26 to concentrate the airflow and increase the air velocity and cooling efficiency of the exit airflows 24 and 26. For example, the air exit ducts 20 and 22 may have a converging passageway aimed toward the desired components. As the exit airflows 24 and 26 pass through this converging passageway, the airflow velocities rise and increase the effectiveness of the airflows at transferring heat away from the desired components. Successive channels and component-focused-ducts also may be provided to cool successively higher-temperature components. Accordingly, the multi-component-focused-cooling duct 10 may cool a plurality of components one after the other by refocusing the airflow toward a downstream component after each successive upstream component.

The multi-component-focused-cooling duct 10 also may comprise a variety of mounting and positional support structures. As illustrated, the multi-component-focused-cooling duct 10 comprises tool-free mounts or vertical retention members or fins 28 and 30. In assembly, the multi-component-focused-cooling duct 10 is positioned between upper and lower structures or components, such that the mounts or fins 28 and 30 abut against the upper structure above the top panel 14 of the multi-component-focused-cooling duct 10. Accordingly, the interaction of the mounts or fins 28 and 30 against the upper structure creates a downward force, which operates to vertically retain the multi-component-focused-cooling duct 10 on the lower structure. The multi-component-focused-cooling duct 10 also may have one or more mounts or supports at a bottom-side of the top panel 14, as illustrated in FIG. 2.

Figure 2:
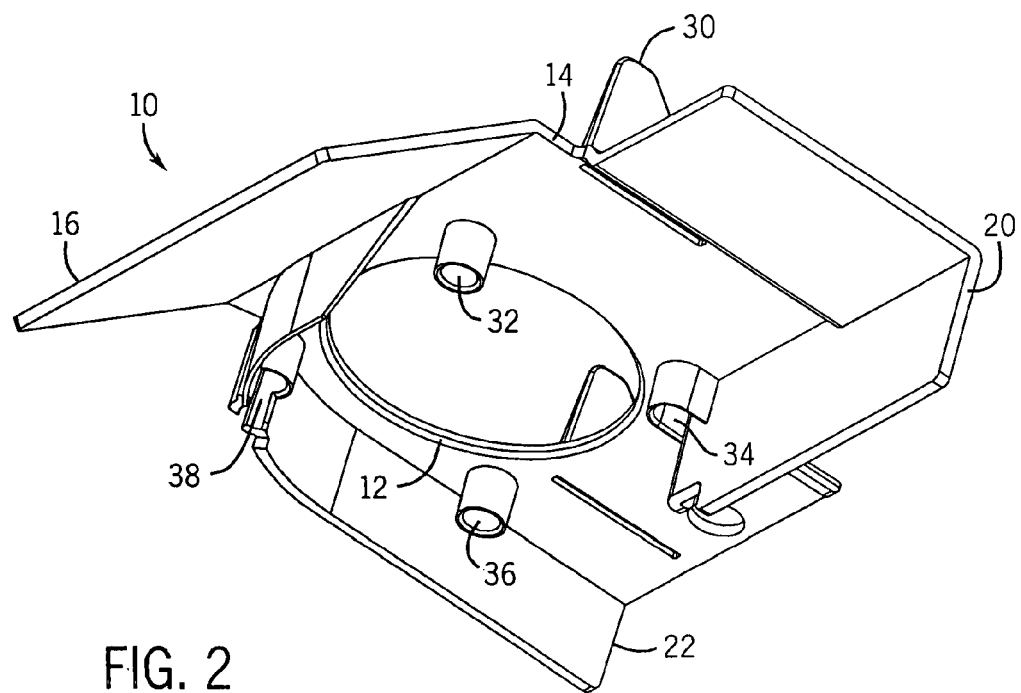
FIG. 2 is a bottom perspective view illustrating an embodiment of the multi-component-focused-cooling duct of FIG. 1.

FIG. 2 is a bottom perspective view illustrating an embodiment of the multi-component-focused-cooling duct 10 of FIG. 1. As illustrated, the multi-component-focused-cooling duct 10 comprises mounts or retention members 32, 34, 36, and 38, which may be coupled with mating members on a lower structure or components (not shown). For example, the retention members 32, 34, 36, and 38 may comprise female members or receptacles that are engageable with male members disposed on the lower structure. However, the retention members 32, 34, 36, and 38 may comprise any suitable tool-free or tool-based retention mechanism, such as a snap-fit mechanism, a latch, a threaded fastener, and so forth. In operation, the multi-component-focused-cooling duct 10 may be lowered onto the lower structure such that the retention members 32, 34, 36, and 38 engage the mating members. An upper structure or component may then be disposed over the multi-component-focused-cooling duct 10 in contact with the mounts or fins 28 and 30, thereby creating a downward retention force. Accordingly, the retention members 32, 34, 36, and 38 laterally retain the duct 10, while the mounts or fins 28 and 30 vertically retain the duct 10. Again, any suitable tool-free or tool-based mounts or retention mechanisms may be employed.

Figure 3:
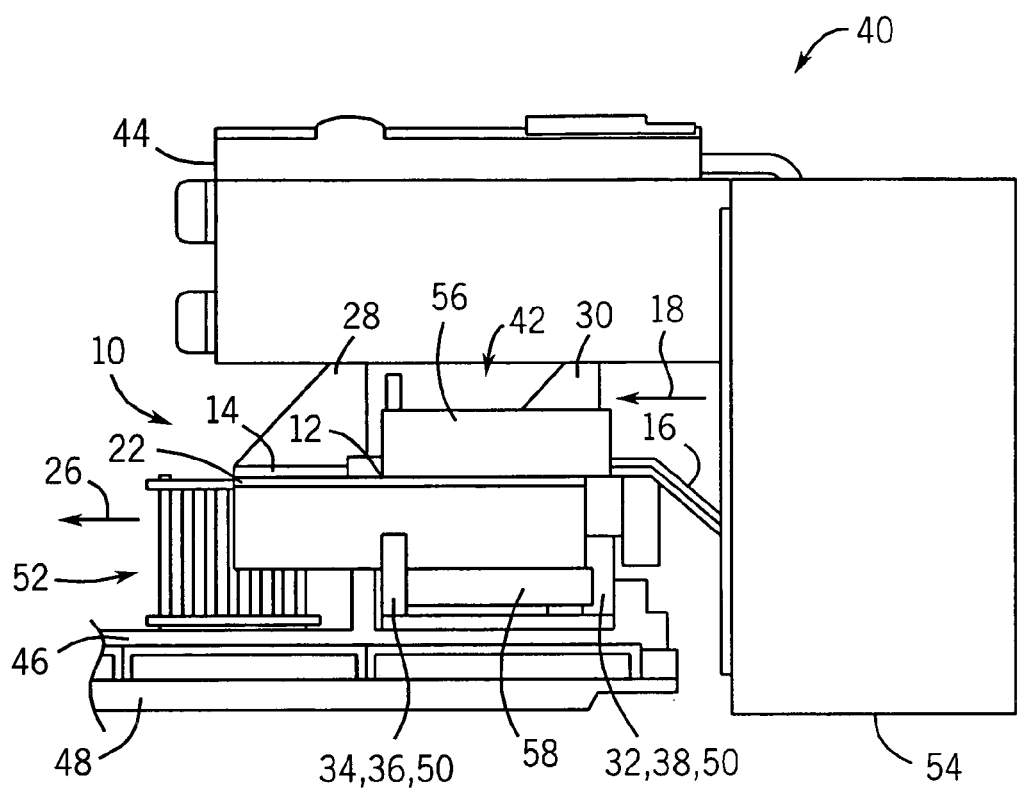
FIG. 3 is a side view illustrating an embodiment of a processor-based device having the multi-component-focused-cooling duct of FIG. 1 disposed about a fan-cooled processor.

FIG. 3 is a side view illustrating an embodiment of a processor-based device 40 having the multi-component-focused-cooling duct 10 of FIG. 1 disposed about a fan-cooled processor assembly 42. As illustrated, an upper component 44 abuts against the mounts or fins 28 and 30 of the multi-component-focused-cooling duct 10, thereby vertically retaining the duct 10 against a lower circuit board 46 and corresponding base structure or casing 48. For example, the upper component 44 may comprise a hard disk drive, an optical drive (e.g., a compact disk drive, a digital video disk drive, etc.), or any other suitable structure or component. The retention members 32, 34, 36, and 38 also engage processor-mounting fasteners 50, which secure the fan-cooled processor assembly 42 to the lower circuit board 46. As illustrated, the multi-component-focused-cooling duct 10 is positioned about a plurality of components, such as the fan-cooled processor assembly 42 and a heat sink and/or component 52. Adjacent the multi-component-focused-cooling duct 10, the processor-based device 40 also has one or more fan units, such as fan 54.

In operation, the fan 54 draws fresh/cool air into the processor-based device 40, thereby directing the inlet airflow 18 into the multi-component-focused-cooling duct 10. As discussed above, the air inlet deflector 16 channels the inlet airflow 18 up over the top panel 14 of the multi-component-focused-cooling duct 10. At the air inlet and fan receptacle, a fan 56 of the fan-cooled processor assembly 42 draws a portion of the inlet airflow 18 into the multi-component-focused-cooling duct 10 and over a processor 58 of the fan-cooled processor assembly 42, thereby transferring heat away from the processor 58 and into the inlet airflow. The multi-component-focused-cooling duct 10 then refocuses (e.g., redirects, concentrates, and/or accelerates) the processor-heated air outwardly through the air exit ducts 20 and 22 onto additional components, such as higher-temperature components. As discussed above, the higher-temperature components may have a higher operating temperature or a higher temperature tolerance than the upstream components or processors. Accordingly, after the airflow cools (and is heated by) the processor 58, a sufficient heat differential remains between the airflow and the higher-temperature components to cool the relatively higher-temperature components. In the illustrated embodiment, the duct 10 focuses (e.g., directs and/or accelerates) a portion of the processor-heated air outwardly through the air exit duct 22 and onto the component 52, as indicated by the exit airflow 26. Another portion of the processor-heated air may be channeled outwardly through the air exit duct 20 and onto a component 60, as indicated by the exit airflow 24 in FIG. 4.

Figure 4:
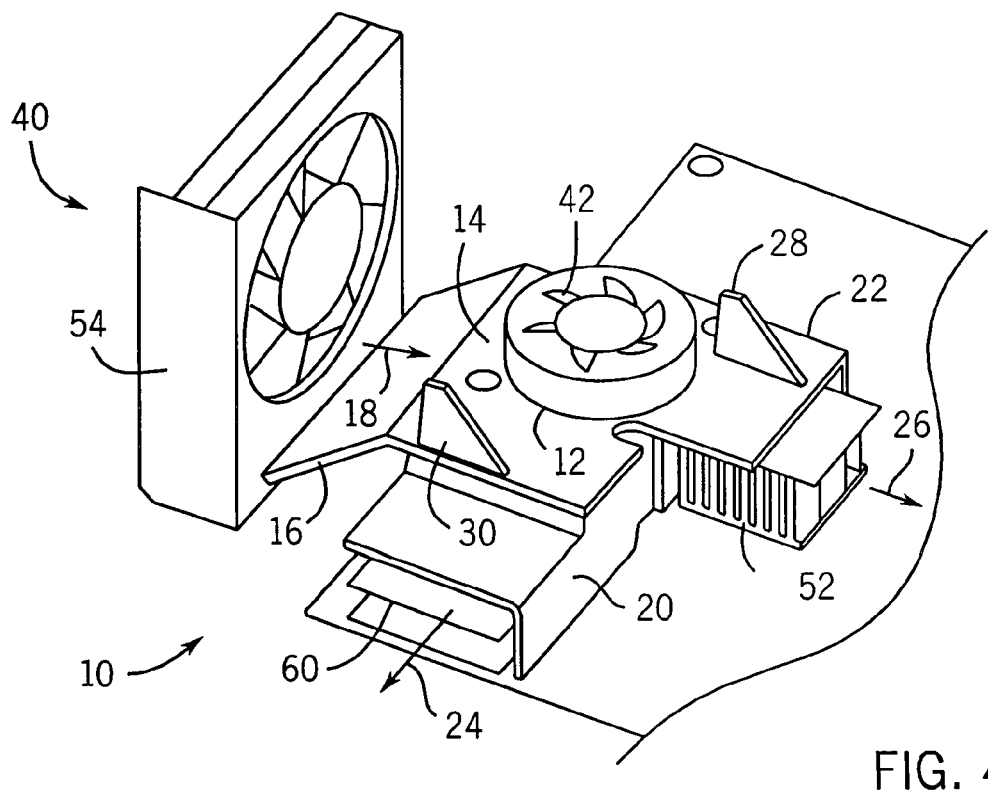
FIG. 4 is a perspective view illustrating an embodiment of the processor-based-device of FIG. 3.

FIG. 4 is a perspective view illustrating an embodiment of the processor-based-device 40 of FIG. 3. As discussed above, the multi-component-focused-cooling duct 10 intakes an air inflow 18 from the fan 54, focuses (e.g., directs, channels, concentrates, and/or accelerates) the air inflow 18 through the fan receptacle 12 and onto the processor 58 via the fan 56, and then refocuses (e.g., redirects, concentrates, and/or accelerates) the processor-heated air onto one or more components at the air exit ducts 20. Accordingly, the multi-component-focused-cooling duct 10 may transmit an airflow to cool a plurality of successive components one after the other by refocusing the airflow toward a downstream cooling region after each upstream cooling region. Each of these cooling regions may be described as a focused-component-cooling region, because the duct 10 focuses the airflow toward a cooling region for a particular component. It also should be noted that the duct 10 may focus the airflow toward these focused-component-cooling regions by aiming or targeting, concentrating, and accelerating the airflow toward the cooling region for the particular component. Accordingly, a relatively greater amount of heat can be transferred away from the particular components disposed in each of the focused-component-cooling regions.

Figure 5:
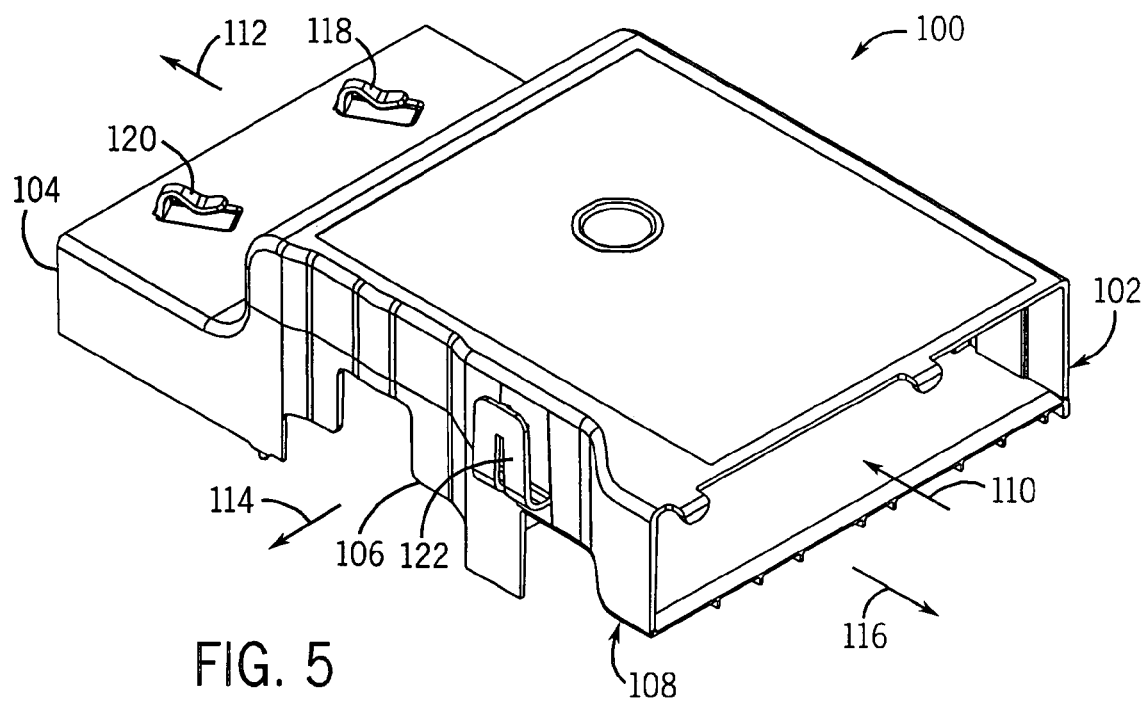
FIG. 5 is a perspective view illustrating an alternative multi-component-focused-cooling duct in accordance with certain embodiments of the present invention.

FIG. 5 is a perspective view illustrating an alternative multi-component-focused-cooling duct 100 in accordance with certain embodiments of the present invention. As illustrated, the multi-component-focused-cooling duct 100 comprises an air inlet duct 102 extending to a plurality of air exit ducts, such as air exit ducts 104, 106, and 108. In operation, the multi-component-focused-cooling duct 100 intakes an inlet airflow 110 through the air inlet duct 102 via one or more internal and external fans (not shown). Using the inlet airflow 110, one or more components may be cooled within the multi-component-focused-cooling duct 100. For example, the multi-component-focused-cooling duct 100 may focus the inlet airflow 110 onto one or more processors or other temperature-sensitive components disposed within the duct 100. In this processor-focused-component-cooling region, heat transfers away from the one or more processors and into the inlet airflow 110.

The multi-component-focused-cooling duct 100 then refocuses (e.g., redirects and/or accelerates) the processor-heated air outwardly through the air exit ducts 104, 106, and 108 into additional focused-component-cooling regions, as indicated by exit airflows 112, 114, and 116, respectively. For example, the duct 100 may focus the exit airflows 112, 114, and 116 onto one or more relatively higher temperature components (e.g., components having higher temperature tolerances), which can be effectively cooled by the processor-heated air. Moreover, the duct 100 may accelerate the exit airflows 112, 114, and 116 to improve the heat transfer away from the components and into the respective exit airflows 112, 114, and 116.

The illustrated multi-component-focused-cooling duct 100 also may comprise a variety of tool-free or tool-based mounts and support structures, such as a snap-fit mechanism, a latch, a threaded fastener, a rail mechanism, and so forth. For example, the multi-component-focused-cooling duct 100 may snap on or latch to a circuit board or component, such as a processor. Additionally, the multi-component-focused-cooling duct 100 may have a variety of cable supports, such as cable hooks 118, 120, and 122.

Figure 6:
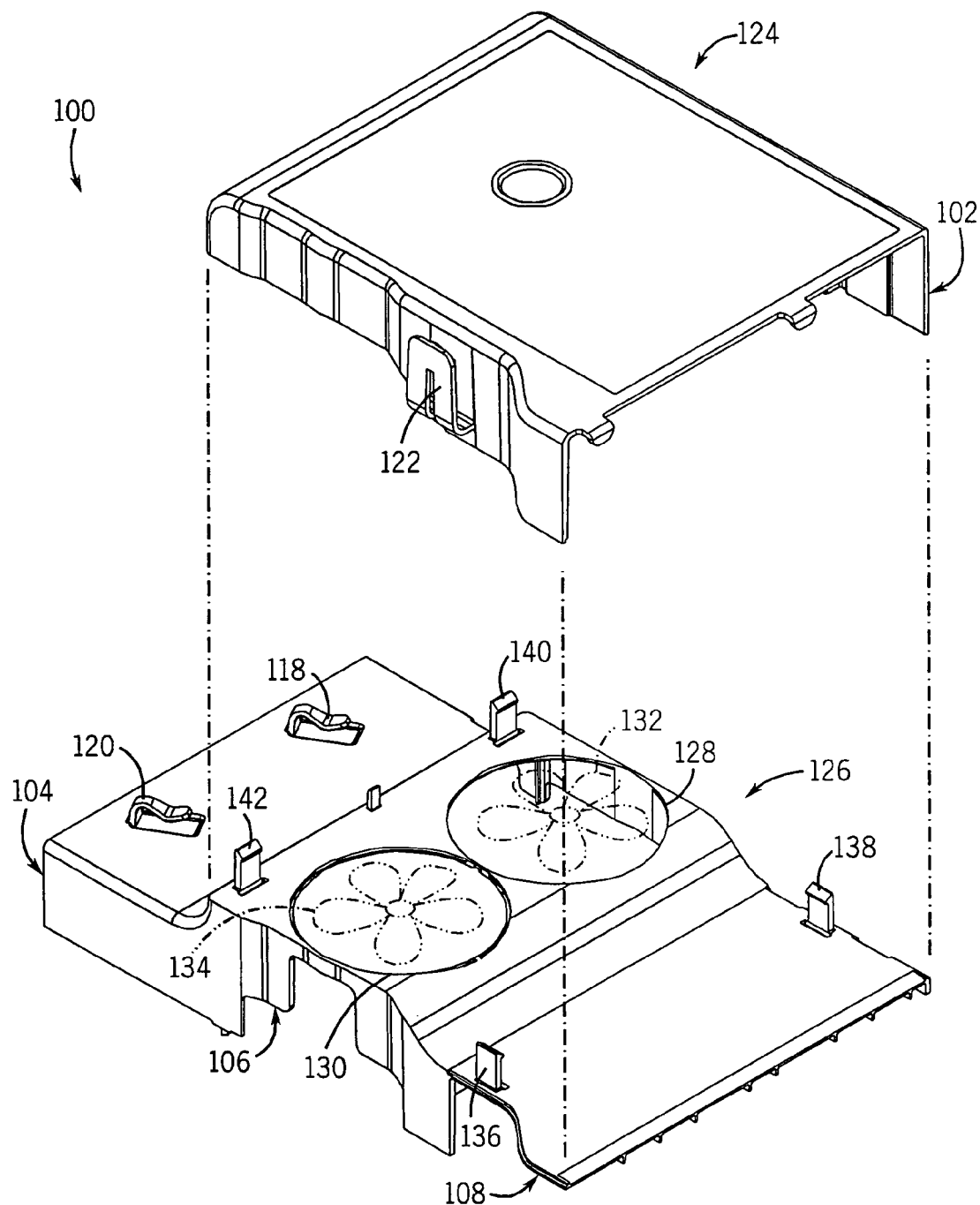
FIG. 6 is an exploded perspective view illustrating inlet and outlet duct sections of the multi-component-focused-cooling duct of FIG. 5 in accordance with certain embodiments of the present invention.

FIG. 6 is an exploded perspective view illustrating inlet and outlet duct sections 124 and 126 of the multi-component-focused-cooling duct 100 of FIG. 5 in accordance with certain embodiments of the present invention. As illustrated, the outlet duct section 126 comprises fan receptacles 128 and 130 to house fans or fan-cooled-components, such as fan units 132 and 134. A plug also may be disposed in one of the fan receptacles 128 and 130 for a single fan or single processor configuration. For a dual fan-cooled processor configuration, the plug may be removed and replaced with one of the fan units 132 and 134. For example, the multi-component-focused-cooling duct 100 may cool a pair of processors disposed below the fan units 132 and 134 in a focused-processor-cooling region. In operation, heat is transferred from the one or more processors to the inlet airflow 110 passing through the focused-processor-cooling region. If one of the fan units 132 and 134 ceases to operate, then the remaining fan unit can continue to force air across the one or more processors and ensure adequate cooling. As discussed above, the multi-component-focused-cooling duct 100 then refocuses the airflow toward additional focused-component-cooling regions via the air exit ducts 104, 106, and 108.

Figure 7:
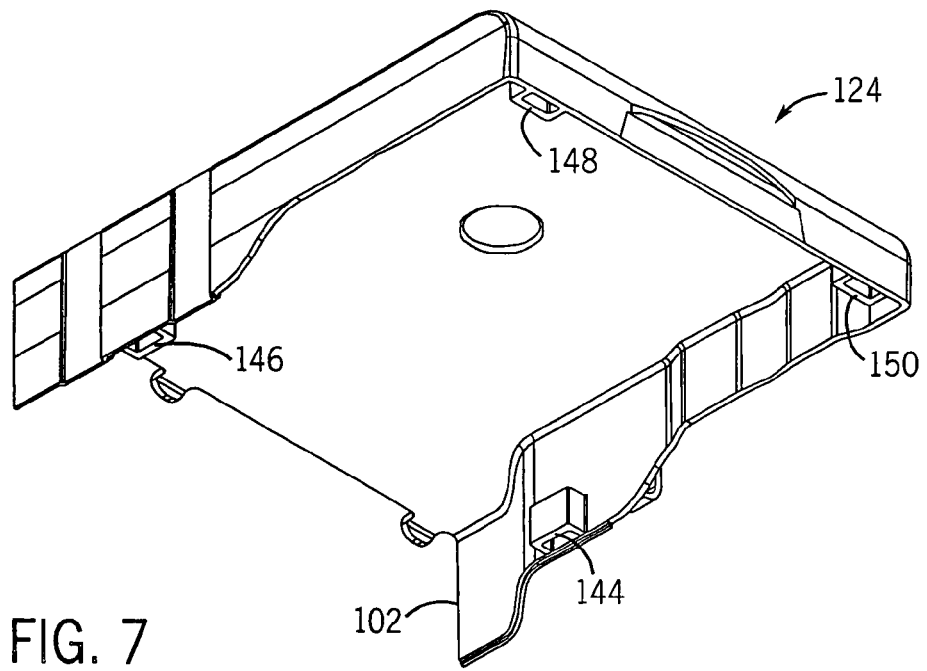
FIG. 7 is a bottom perspective view illustrating an embodiment of the inlet duct section of FIG. 6.

For additional protection and air focusing, the inlet duct section 124 may be disposed over the outlet duct section 126, such that the inlet duct section 124 covers the fan receptacles 128 and 130 and corresponding fan-cooled-components or fan units 132 and 134. Any suitable tool-free or tool-based couplings may be used to couple the inlet and outlet duct sections 124 and 126. However, the illustrated multi-component-focused-cooling duct 100 has a plurality of snap-fit mechanisms or latches disposed on the inlet and outlet duct sections 124 and 126. As illustrated in FIG. 6, the outlet duct section 126 comprises male latches or snap fit members 136, 138, 140, and 142, which are coupleable with mating latches or snap fit receptacles on the inlet duct section 124. As illustrated in the bottom perspective view of FIG. 7, the inlet duct section 124 comprises female snap-fit members or latch receptacles 144, 146, 148, and 150. Accordingly, the inlet and outlet duct sections 124 and 126 may be tool-lessly coupled to form a closed channel about the fan receptacles 128 and 130.

In assembly, the inlet duct section 124 may operate as a barrier to reduce the likelihood of physical damage to the fan-cooled components or fan units 132 and 134. Additionally, the inlet duct section 124 may operate to scoop or capture a greater portion of the inlet airflow 110 into the multi-component-focused-cooling duct 100.

What is claimed is:

1. An electronic device, comprising:
   a housing;
   a plurality of electronic components disposed in the housing;
   a duct disposed removably in the housing separate from the plurality of electronic components, wherein the duct comprises:
      a central duct portion having an inlet opening and walls extending in a first direction toward a first electronic component; and
      an elongated duct portion extending away from the central duct portion in a second direction toward a second electronic component, wherein the second direction is different from the first direction; and a fan pneumatically coupled to the duct.

2. The electronic device of claim 1, comprising another elongated duct portion extending away from the central duct portion in a third direction toward a third electronic component, wherein the third direction is different from the first and second directions.

3. The electronic device of claim 1, wherein the elongated duct comprises an L-shaped wall structure extending in the second direction.

4. The electronic device of claim 1, wherein the elongated duct comprises a U-shaped wall structure extending in the second direction.

5. The electronic device of claim 1, wherein the duct converges in geometry from the central duct portion to the elongated duct portion.

6. The electronic device of claim 1, wherein the first direction is substantially perpendicular to the second direction.

7. The electronic device of claim 1, wherein the first direction is substantially parallel and opposite to the second direction.

8. The electronic device of claim 1, comprising a circuit board having the first component and the second component, wherein the first direction is substantially perpendicular to the circuit board and the second direction is substantially parallel to the circuit board.

9. An electronic device, comprising:
   a housing;
   a circuit board mounted in the housing;
   a processor mounted on the circuit board;
   an electronic component mounted on the circuit board;
   a fan disposed in the housing;
   a duct removably disposed in the housing, wherein the duct comprises:
      a downward flow section disposed above the circuit board and at least partially surrounding the processor; and
      an elongated flow section extending away from downward flow section along the circuit board toward the electronic component.

10. The electronic device of claim 9, wherein the downward flow section comprises an airflow opening disposed above the processor.

11. The electronic device of claim 10, wherein the downward flow section comprises a ramp leading from the circuit board to the airflow opening.

12. The electronic device of claim 10, wherein the airflow opening is disposed in a first wall section that is generally parallel and offset from the circuit board, and a second wall section extends from the first wall section toward the circuit board.

13. The electronic device of claim 9, wherein the downward flow section comprises a plurality of fan receptacles disposed above the processor.

14. The electronic device of claim 9, wherein the elongated flow section comprises a first wall that is generally parallel and offset from the circuit board, and a second wall that extends from the first wall toward the circuit board.

15. The electronic device of claim 14, wherein the elongated flow section comprises a third wall opposite from the second wall, and the third wall extends from the first wall toward the circuit board.

16. The electronic device of claim 9, wherein the duct abuts, and is vertically retained by the abutment between, the circuit board and an upper component disposed above and offset from the circuit board.

17. An electronic device, comprising:

a circuit board;

first and second electronic component mounted to the circuit board;

a fan oriented toward the circuit board above the first electronic component; and a duct disposed between the fan and the circuit board, wherein the duct has walls extending at least partially around the first electronic component and extending along the circuit board toward the second electronic component, wherein the walls diverge from the first electronic component into two elongated channels along the circuit board toward the second electronic component and a third electronic component mounted to the circuit board.

18. The electronic device of claim 17, wherein the fan is generally parallel to the circuit board.

19. The electronic device of claim 17, wherein the walls converge from the first electronic component to the second electronic component.

* * * * *